United States Patent [19]

Love

[11] Patent Number: 5,463,521
[45] Date of Patent: Oct. 31, 1995

[54] POWER SUPPLY PROTECTION CIRCUIT

[75] Inventor: W. John Love, Dunlap, Ill.

[73] Assignee: Caterpillar Inc., Peoria, Ill.

[21] Appl. No.: 253,817

[22] Filed: Jun. 3, 1994

Related U.S. Application Data

[63] Continuation of Ser. No. 972,337, Nov. 6, 1992, abandoned.
[51] Int. Cl.⁶ .................................. H02H 9/00; H02H 5/04
[52] U.S. Cl. ................................ 361/58; 361/56; 361/103
[58] Field of Search .................................. 361/18, 56, 58,
361/100, 101, 111, 103, 105; 307/10.7;
323/221, 224, 226, 274, 284, 311, 312,
303, 908

[56] References Cited

U.S. PATENT DOCUMENTS

| | | | |
|---|---|---|---|
| 4,849,683 | 7/1989 | Flolid | 323/284 |
| 4,883,211 | 1/1990 | Bynum et al. | 361/18 |
| 5,008,771 | 4/1991 | Palara | 361/103 |
| 5,195,007 | 3/1993 | Kikuchi et al. | 361/21 |
| 5,212,619 | 5/1993 | Baudelot et al. | 361/91 |

*Primary Examiner*—A. D. Pellinen
*Assistant Examiner*—Ronald W. Leja
*Attorney, Agent, or Firm*—David M. Masterson

[57] ABSTRACT

In one aspect of the present invention, an apparatus for protecting electronic circuit elements from hazardous voltages is provided. The apparatus includes a source of electrical energy that produces electrical energy having a predetermined energy level. An electrical load is connected to the electrical energy source and responsively receives electrical energy. A signaling device receives electrical energy from the electrical energy source and produces an overvoltage signal in response to receiving electrical energy greater than the predetermined energy level. An NMOSFET is connected to the electrical load, and controllably regulates the electrical current flowing through the electrical load. A control device receives the overvoltage signal and responsively controls the operation of the NMOSFET.

11 Claims, 2 Drawing Sheets

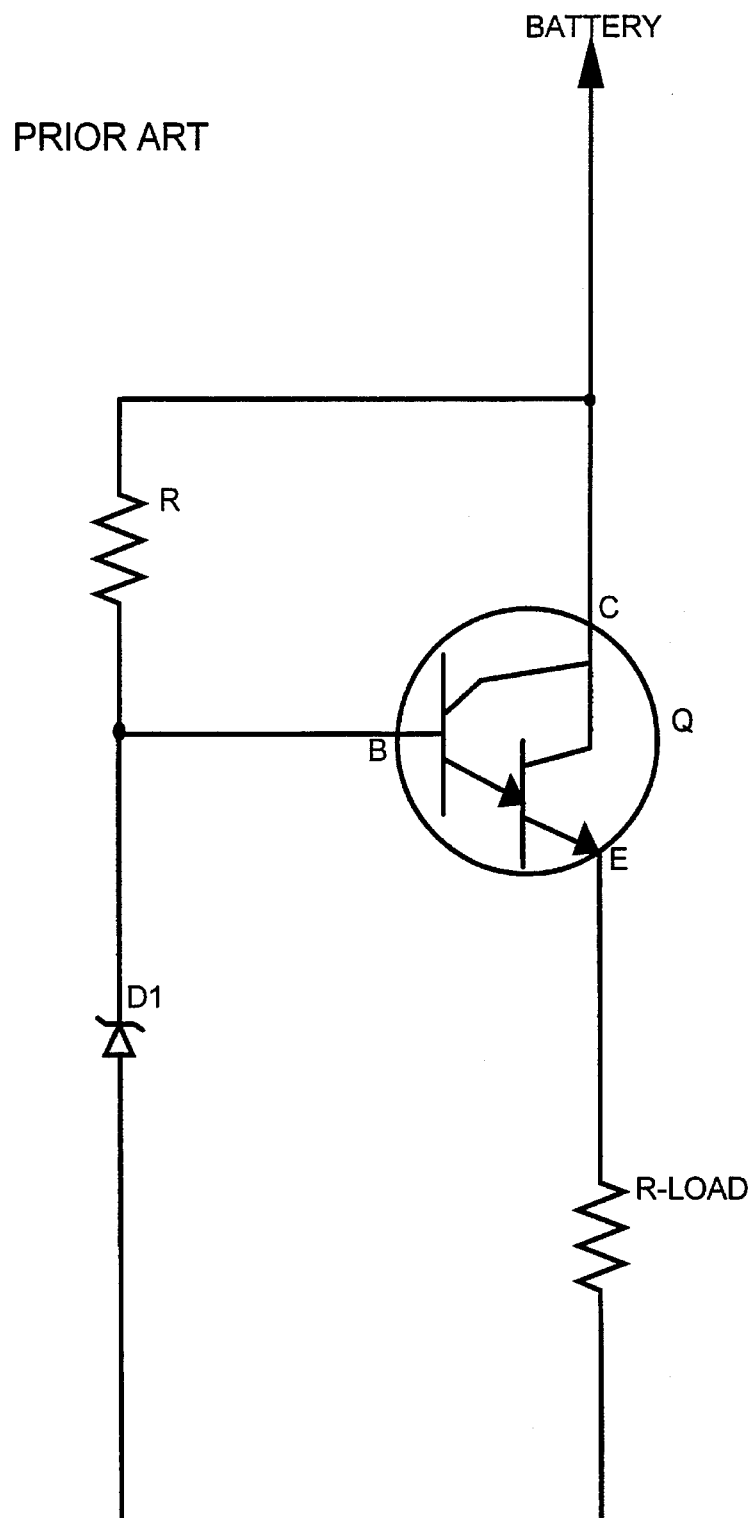
Fig_1_

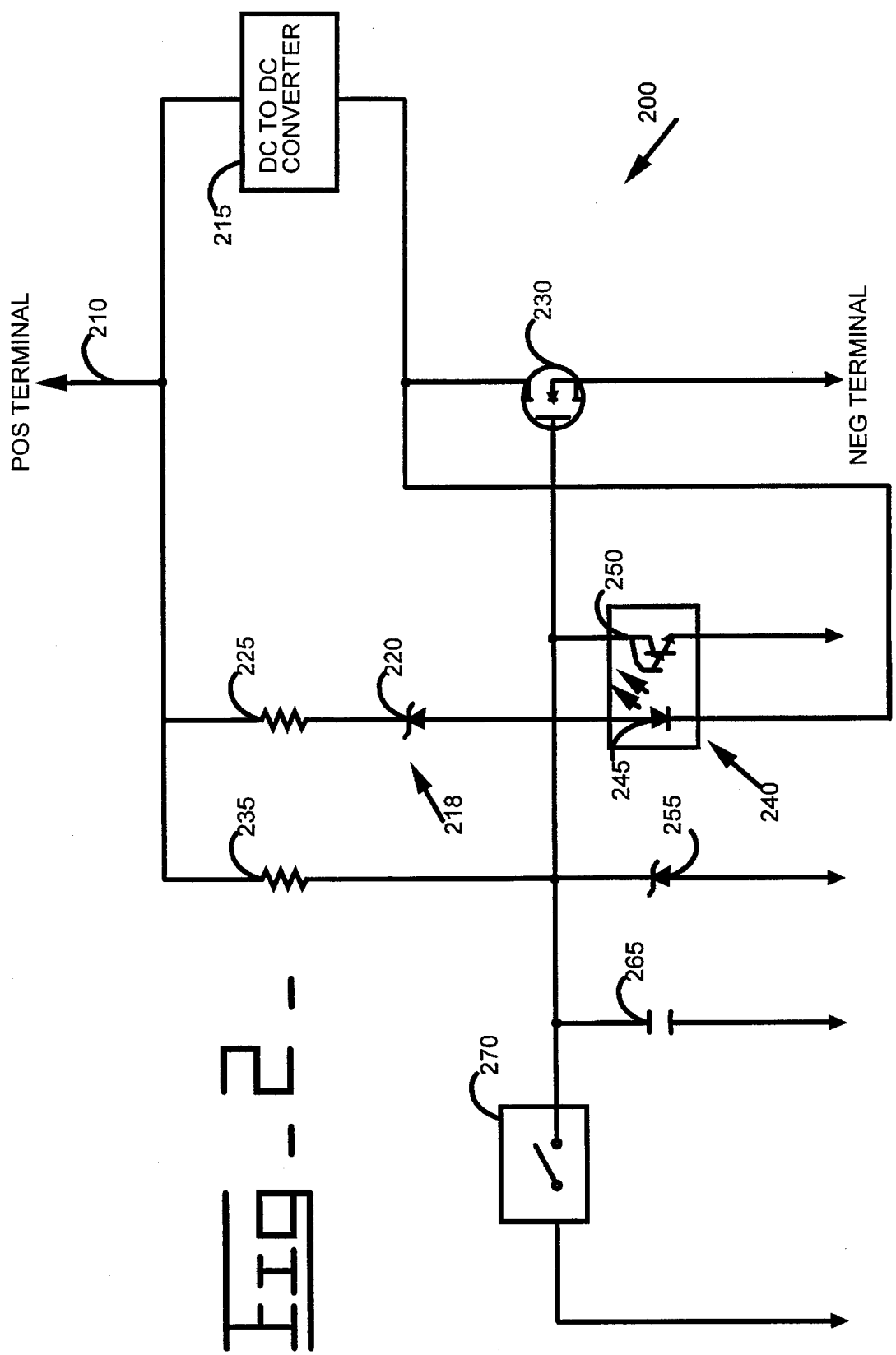
FIG--2

POWER SUPPLY PROTECTION CIRCUIT

This is a file wrapper continuation of application Ser. No. 07/972,337, filed Nov. 6, 1992, now abandoned.

TECHNICAL FIELD

This invention relates generally to a circuit for protecting a power supply from hazardous voltages and more particularly, to a circuit which comprises an NMOSFET which aids in protecting a power supply from hazardous voltages.

BACKGROUND ART

The power supply, such as a DC to DC converter, for a vehicle electronic system typically receives electrical power from the vehicle battery. Unfortunately, the power supply may be exposed to hazardous voltages. For example, an "alternator load dump" causes damaging voltage spikes that can cause catastrophic failure of the vehicle electronics. Each voltage spike may have a magnitude of 150 volts with a duration of several milliseconds. Typically, these voltage spikes occur every few seconds. An alternator load dump is caused by an abrupt change in the alternator load. For example, the headlights being turned "off" or a poor battery connection can abruptly change the alternator load.

One solution to protecting the power supply for the vehicle's electronic system from damaging voltage spikes is shown in the circuit of FIG. 1. During normal operation, the illustrated circuit provides battery voltage to an electrical load, R-load (representative of the power supply). During abnormal conditions, e.g. hazardous voltage spikes, a Zener diode, D, effectively "clamps" the voltage impressed across R-load at the Zener diode voltage.

However, several problems are inherent with the design of the illustrated circuit. For example, approximately a 3 volt drop occurs across the collector-emitter junction of the bi-polar Darlington transistor, Q. Consequently, the 13.8 volts from a fully charged 12 volt battery is reduced to 10.8 volts, which may not be sufficient to power the vehicle electronics. Further, the transistor dissipates a great amount of power, heating the transistor. Therefore a heat sink is required dissipate the thermal energy. The heat sink adds cost and bulk to the circuit, rendering electronic packaging difficult.

The present invention is directed to overcoming one or more of the problems as set forth above.

DISCLOSURE OF THE INVENTION

In one aspect of the present invention, an apparatus for protecting electronic circuit elements from hazardous voltages is provided. The apparatus includes a source of electrical energy that produces electrical energy having a predetermined energy level. An electrical load is connected to the electrical energy source and responsively receives electrical energy. A signaling device receives electrical energy from the electrical energy source and produces an overvoltage signal in response to receiving electrical energy greater than the predetermined energy level. An NMOSFET is connected to the electrical load, and controllably regulates the electrical current flowing through the electrical load. A control device receives the overvoltage signal and responsively controls the operation of the NMOSFET.

BRIEF DESCRIPTION OF THE DRAWINGS

For a better understanding of the present invention, reference may be made to the accompanying drawings in which:

FIG. 1 shows a prior art voltage protection circuit; and

FIG. 2 shows a preferred voltage protection circuit embodying the present invention.

BEST MODE FOR CARRYING OUT THE INVENTION

FIG. 2 shows an apparatus 200 which protects an electronic element from damaging or hazardous voltages. A source of electrical energy 210 produces electrical energy having a predetermined energy level. For example, the electrical energy source may include a vehicle battery having a predetermined nominal voltage of 12 or 24 volts. The vehicle battery includes positive and negative terminals.

An electrical load 215 is connected to the battery terminals and responsively receives electrical energy. The electrical load may comprise a power supply, such as a DC to DC converter, for example. The DC to DC converter supplies electrical energy to other electronic elements. As may be apparent to those well known in the art, the present invention not only protects a DC to DC converter from damaging voltages, but may protect other electronic devices as well.

A signaling means 218 is provided to produce an overvoltage signal in response to receiving a harmful voltage. The signaling means includes a first Zener diode 220. Here, the breakdown voltage of the first Zener diode establishes a threshold voltage level. Any voltage greater than the threshold voltage level is regarded to be hazardous. The first Zener diode may have a breakdown voltage of 30 volts, for example. The first Zener diode 220 is shown as being connected to the positive battery terminal through a first resistor 225. The first resistor is provided to limit the current through the first Zener diode and may have a resistance value of 24 Kohms, for example.

An n-channel metal-oxide-semiconductor field effect transistor (NMOSFET) 230 is shown having a drain connected to the electrical load and a gate connected to the positive battery terminal via a second resistor 235. Additionally, a source and substrate of the NMOSFET are both connected to the negative battery terminal. In the preferred embodiment, the NMOSFET should have a low drain-source resistance, $R_{ds}$, when biased "fully-on". The NMOSFET is similar to that manufactured by International Rectifier as Model No. IRF540, for example.

A control means 240 receives the overvoltage signal and responsively controls the operation of the NMOSFET. The control means preferability is an optically coupled isolator. The optically coupled isolator is comprised of a light-emitting diode (LED) 245 and a photo-Darlington transistor 250. As shown, an anode of the LED is connected to the anode of the first Zener diode and a cathode of the LED is connected to the drain of the NMOSFET. A collector of the phototransistor is connected to the gate of the NMOSFET, a base is optically coupled to the LED, and an emitter is connected to the negative battery terminal.

An cathode of a second Zener diode 255 is connected to the NMOSFET gate and an anode is connected to the negative battery terminal. The second resistor 235 is provided to limit the current through the second Zener diode and may have a resistance value of 100 Kohms, for example.

The second diode limits the gate-source voltage of the NMOSFET to approximately 15 volts (the Zener breakdown voltage).

A capacitor 265 is included to protect the NMOSFET from static discharge. As shown the capacitor is connected in electrical parallel with the NMOSFET gate-source. The capacitance of the capacitor may have a value of 0.1 microfarads, for example.

A thermostat 270 is connectable between the gate of the NMOSFET and the negative battery terminal. The thermostat connects the NMOSFET gate to the negative battery terminal in response to the temperature of the NMOSFET reaching a predetermined temperature of 85 degree Celsius, for example. In this manner the thermostat de-energizes the NMOSFET to protect the NMOSFET from damaging temperatures. The thermostat is similar to that manufactured by Airpax as Model No. 67F085, for example.

The present invention is well suited towards vehicle applications; however, it is apparent that the present invention is applicable to other applications where voltage protection is desired.

INDUSTRIAL APPLICABILITY

To best illustrate the advantages of the present invention, its operation will now be discussed.

Under normal conditions, e.g. the absence of hazardous voltages, the NMOSFET is utilized as a pass transistor. For example, the battery voltage is sufficient to energize the NMOSFET "fully-on" such that the NMOSFET exhibits low impedance. The low impedance NMOSFET dissipates little energy and operates in an efficient manner. Therefore, the electrical load is able to receive the required amount of battery voltage—even with a 12 volt battery.

Under abnormal conditions, e.g. the existence of hazardous voltages, the NMOSFET is utilized as an active load. Advantageously, the signaling means determines the occurrence of a damaging voltage spike and responsively produces an overvoltage signal. The control means receives the overvoltage signal and responsively controls the operation of the NMOSFET. As shown in FIG. 2, the electrical load and the NMOSFET are connected as a voltage divider. Thus, the NMOSFET is adapted to regulate the current through the electrical load; thereby, preventing the electrical load from becoming damaged due to hazardous voltages.

For example, a damaging voltage spike exceeds the breakdown voltage of the first Zener diode, biasing the first Zener diode "on". Responsively, the first Zener diode delivers an overvoltage signal to the LED. Upon receipt of the overvoltage signal the LED energizes, which in turn energizes the phototransistor. The energized phototransistor shunts an amount of current from the gate of the NMOSFET. The NMOSFET gate-source voltage decreases, causing the NMOSFET impedance, $R_{ds}$, to increase to a predetermined impedance level. As a consequence, the current through the electrical load is reduced to prevent the electrical load from receiving damaging voltages. Further, the electrical load receives electrical energy from the battery at substantially the breakdown voltage of the first Zener diode. Once the damaging voltage spike ceases, the circuit returns to normal operation.

As shown, the capacitor 265 and the second resistor 235 form an RC filter 260. The RC filter stabilizes the gate-source voltage of the NMOSFET to prevent the gate-source voltage from oscillating.

Advantageously, the present invention utilizes the efficient properties of the NMOSFET to regulate the current flow through the electrical load. The first Zener diode is used as a signaling device to determine when a damaging voltage spike occurs. Further, the NMOSFET not only regulates the current through the electrical load but additionally regulates the current flowing through the Zener diode. Thus, a fast reacting Zener diode can be utilized to aid in countering the damaging effects of a fast occurring voltage spike.

Other aspects, objects and advantages of the present invention can be obtained from a study of the drawings, the disclosure and the appended claims.

I claim:

1. An apparatus for protecting electronic circuit elements from hazardous voltages produced by an energy source, comprising:

a energy source for producing electrical energy having a predetermined energy level, said energy source having positive and negative terminals;

an electrical load being connected to the positive and negative terminals of said electrical energy source, said electrical load receiving electrical energy from said energy source;

a first Zener diode for receiving electrical energy from said electrical energy source and producing an overvoltage signal in response to receiving electrical energy greater than the breakdown voltage of the first Zener diode;

an NMOSFET for controllably regulating the electrical current flowing through said electrical load, said NMOSFET having a drain, gate, source and substrate, and being connected between the negative terminal of said energy source and said electrical load; and control means for receiving the overvoltage signal and responsively limiting the NMOSFET gate-source voltage to increase the impedance of said NMOSFET to a predetermined impedance level, thereby limiting the current flowing through said electrical load to protect said electrical load from hazardous voltages, wherein said NMOSFET remains conducting to allow said electrical load to receive electrical energy from said energy source at substantially the breakdown voltage of said first Zener diode during a hazardous voltage condition.

2. An apparatus, as set forth in claim 1, wherein the drain is connected to said electrical load, the gate is connected to the positive terminal of said electrical energy source, the source and substrate are connected to the negative terminal of said electrical energy source.

3. An apparatus, as set forth in claim 2, wherein said first Zener diode has a cathode connected to the positive terminal of said electrical energy source and an anode connected to the negative terminal of said electrical energy source.

4. An apparatus, as set forth in claim 3, wherein said control means includes an optically coupled isolator.

5. An apparatus, as set forth in claim 4, wherein said optically coupled isolator includes:

a light-emitting diode having a cathode connected to the drain of said NMOSFET and an anode connected to the anode of said first Zener diode; and a photo-Darlington transistor having a collector, base and emitter, the collector being coupled to the gate of said NMOSFET, the base being optically connected to said light-emitting diode, and the emitter being connected to the negative terminal of said electrical energy source.

6. An apparatus, as set forth in claim 5, including a thermostat being connectable between the gate of said NMOSFET and the negative terminal of said electrical energy source, said thermostat connecting the NMOSFET gate to the negative terminal in response to the temperature of said NMOSFET reaching a predetermined temperature.

7. An apparatus, as set forth in claim 6, including a second Zener diode having a cathode connected to the gate of the NMOSFET and an anode connected to the negative terminal of said electrical energy source, said second Zener diode limiting the phototransistor collector-emitter voltage and NMOSFET gate-source voltage.

8. An apparatus, as set forth in claim 7, including a first resistor connected between the positive terminal of said electrical energy source and the cathode of said first Zener diode.

9. An apparatus, as set forth in claim 8, including an RC filter, the RC filter including:

a capacitor connected in electrical parallel with said second diode; and a second resistor connected between the positive terminal of said electrical energy source and the cathode of said second Zener diode.

10. An apparatus, as set forth in claim 9, wherein said source of electrical energy includes a vehicle battery.

11. An apparatus, as set forth in claim 10, wherein said electrical load includes a DC to DC converter.

* * * * *